US006839016B2

(12) United States Patent
Roza

(10) Patent No.: US 6,839,016 B2
(45) Date of Patent: Jan. 4, 2005

(54) PIPELINE AD CONVERTER

(75) Inventor: Engel Roza, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/480,266

(22) PCT Filed: Jun. 5, 2002

(86) PCT No.: PCT/IB02/02104

§ 371 (c)(1),
(2), (4) Date: Dec. 8, 2003

(87) PCT Pub. No.: WO02/101931

PCT Pub. Date: Dec. 19, 2002

(65) Prior Publication Data

US 2004/0189500 A1 Sep. 30, 2004

(30) Foreign Application Priority Data

Jun. 8, 2001 (EP) ............................................. 01202196

(51) Int. Cl.[7] ................................................. H03M 1/38
(52) U.S. Cl. ......................... 341/161; 341/155; 341/143
(58) Field of Search ................................ 341/118, 120, 341/126, 143, 155, 159, 161, 162

(56) References Cited

U.S. PATENT DOCUMENTS

| 5,982,313 | A | * | 11/1999 | Brooks et al. | ............... 341/143 |
| 6,184,809 | B1 | * | 2/2001 | Yu | ............................... 341/120 |
| 6,288,663 | B1 | * | 9/2001 | Hester et al. | ................ 341/155 |
| 6,373,424 | B1 | * | 4/2002 | Soenen | ......................... 341/161 |
| 6,600,440 | B1 | * | 7/2003 | Sakurai | ........................ 341/172 |
| 6,606,042 | B2 | * | 8/2003 | Sonkusale et al. | ........... 341/120 |
| 6,734,818 | B2 | * | 5/2004 | Galton | ........................ 341/161 |

OTHER PUBLICATIONS

Roza, Engel, IEEE Transactions on Circuit and System II, vol. 44, No. 11, Nov. 1997, p. 907–p. 914.

* cited by examiner

*Primary Examiner*—Michael Tokar
*Assistant Examiner*—Linh V Nguyen
(74) *Attorney, Agent, or Firm*—Michael J. Uxe

(57) ABSTRACT

A pipeline AD converter comprising a cascade of AD-converter stages, whereby the sampling noise generated by a former stage of the cascade is AD-converted by the next stage in the cascade and the digital signals of the stages are combined to generate an error-reduced digital representation of the analog input signal. Applying the input signal to a synchronous $\Sigma\Delta$ modulator and to an asynchronous $\Sigma\Delta$ modulator and comparing the output signals of the $\Sigma\Delta$ modulators generates the sampling noise.

5 Claims, 4 Drawing Sheets

PIPELINE AD CONVERTER

BACKGROUND AND SUMMARY OF THE INVENTION

This invention relates to a pipeline AD-converter comprising a cascade of AD-converter stages, each having an analog input, a digital output and a synchronous ΣΔ modulator with an input coupled to said analog input and an output coupled to said digital output of the stage, each AD-converter stage of the cascade, except the last one, further comprising an error signal generator for generating a baseband error signal from the signal applied to said analog input and the signal derived from said digital output and for applying the baseband error signal to the analog input of the next AD-converter stage in the cascade, the pipeline AD-converter further comprising a digital signal reconstruction path receiving the digital outputs of the AD-converter stages and generating there from an error-reduced digital representation of the analog signal applied to the analog input of the first stage in the cascade. Such pipeline AD-converter is known from the article ☐A 16-bit Oversampling A-to-D Conversion Technology Using Triple-Integration Noise Shaping☐ by Y. Matsuya et al. in IEEE Journal of Solid State Circuits, Vol. sc-22, no. 6, December 1987, pp. 921–929.

A synchronous ΣΔ modulator is a 1-bit AD-converter. This kind of AD-converters has the advantage of having no nonlinear distortion and consequently a potentially wide dynamic range. In practice the dynamic range is upper-limited only by the level of the supply voltage. However, these AD-converters have the drawback that the signal to noise ratio is rather poor, especially when the sample rate is relatively close to the Nyquist rate. This drawback can be overcome by choosing a high sampling ratio. For example, with audio signals having a bandwidth of 20 kHz, and a Nyquist rate of 44.1 kHz, an excellent signal to noise ratio is obtained with a sampling rate of 2.8 MHz, i.e. an oversampling ratio of 64. However, when the signal bandwidth is substantially larger, such as video signals with a baseband of 5 MHz and a Nyquist rate of 13.5 MHz, an oversampling ratio of 64 would mean a sampling ratio of 864 MHz, which is too cumbersome for present day semiconductor technology.

A pipeline of ΣΔ modulators may solve this problem. The sample rate may be relatively low, e.g. 108 MHz for a 5 MHz bandwidth signal, i.e. an oversampling ratio of 8. The error signal may be derived by a subtracter, which subtracts the analog input signal from the digital output of the ΣΔ modulator. The relatively large baseband error signal generated by the first stage of the pipeline is AD-converted in the second stage and the so digitized error signal is, in the digital reconstruction path, processed reciprocally with respect to the analog processing in the first stage and subsequently used to cancel the error signal of the first stage in the digital output signal. The smaller baseband error signal generated by the second stage is digitized in the third stage of the cascade and subsequently, after appropriate digital signal processing, used to cancel the second error in the digital output signal and so on. In this way an AD converter is obtained with a noise level that is smaller the more stages are used, while the advantages, which are inherent to the use of 1-bit AD converters, are maintained.

However, by the error generator of the prior art it appeared difficult to derive the baseband error with large precision. The large precision is required to obtain a full cancellation of the error in the digital reconstruction path. The more cancellation is desired, the higher the precision should be. A limited precision would result in residual errors, which cannot be cancelled by the proposed method. Therefore the degree of precision should be such that the difference between an ideally obtained baseband error and the practically obtained baseband error is at least an order of magnitude less than the baseband error itself. It has been found, that one of the reasons for the lack of precision is the appearance of a signal related component in the baseband error signal that can be larger than the noisy component. The maximum magnitude of the signal that can be applied to the second stage of the cascade before overloading this stage is therefore smaller as it could be if the signal related error component would have been removed. This is a pity because it is desirable to drive the second stage with a baseband error signal as large as possible in order to make the influence of the sampling noise of the second stage as small as possible. The higher this influence is, the more stages in the cascade are required to obtain the desired performance specification. The main reason that limits the precision is the subtraction itself. Ideally, one of the two inputs of the subtracter should be the noise free analog input signal and the other one should be the same signal plus error where the error is the sampling noise only and the result would be a subtraction which results in the generation of the sampling noise only. In practice it is difficult to construct the signal paths of the two inputs to the subtracter such that the two magnitudes of the signal components are the same. One reason for it is the different nature of these two signals: one is an analog signal by nature and the other one is a signal with a binary waveform. Usually voltage-to-current converters are used in the construction of subtracters. The transfer gain of such a voltage-to-current converter is quite different for analog waveforms and binary waveforms. The result of this is the generation of a baseband error signal with an undesirable signal related component. It is the object of the invention to substantially reduce the level of the input signal related component in the output of the error signal generators of the pipeline AD converter and the pipeline AD converter of the present invention is therefore characterized in that said error signal generator comprises an asynchronous ΣΔ modulator having an input connected to the analog input of the AD-converter stage, means for subtracting the signals from the outputs of the synchronous and the asynchronous ΣΔ modulators and means for low pass filtering the result of the subtraction and for applying the filtered signal as error signal to the analog input of the next AD-converter stage in the cascade.

Asynchronous ΣΔ modulators are known per se in the art, e.g. from IEEE Transactions on Circuits and Systems, pp. 907–914, vol. 44, no 11, November 1997. The structure of the asynchronous ΣΔ modulator may preferably be substantially equal (matched) to that of the synchronous ΣΔ modulator except in that a clock pulse controls the comparator of the latter and the comparator of the former does not. The output signal of the asynchronous ΣΔ modulator is a square wave the duty-cycle of which is linearly proportional to the input signal. In contradistinction with a synchronous ΣΔ modulator, the asynchronous ΣΔ modulator is not subject to quantization noise because all analog properties are maintained through the time-continuous character of the zero-crossings in the square-wave signal. Therefore the output signal of an ideal asynchronous modulator can be regarded as a true replica of the input signal i.e. the low-frequency part of the spectrum of the output signal is identical to the spectrum of the input signal. On the other hand, when the synchronous and the asynchronous ΣΔ modulators are not ideal but, apart from the clock synchronization of the former, matched to each other, then the input signal component in the output of the two modulators is substantially equal. Consequently, when, according to the invention the output signals of the two modulators are subtracted from each other and low pass filtered, then the input signal components of the modulators cancel against each other and only the quantization noise delivered by the synchronous ΣΔ modulator remains. Other advantages of the use of an asynchronous ΣΔ modulator are that, as with the synchronous modulator, the whole dynamic range of the asynchronous modulator as determined by the available supply voltages can be utilized without non-linear distortion problems and that, by the virtue of the switched nature of the asynchronous and synchronous signals, the required operations, such as adding and subtracting, can be executed with large precision.

A second reason why it is difficult to obtain a good precision is that there is a phase shift between the two input signals of the subtracter. This phase shift is caused by the sample delay from the synchronous SD modulator. Therefore, in order to further enhance the input signal component cancellation, the pipeline AD converter of the present invention is further characterized by delay means in the output of the asynchronous ΣΔ modulator for compensating the delay of the synchronous ΣΔ modulator.

The third reason that limits the precision is the transfer gain of the subtracter. Even in the case that there is an ideal magnitude matching of the two inputs to the subtracter there is a difficulty to establish the effective gain of the noise between input and output of the subtracter. This gain should be precisely known, because its inverse has to be implemented in the digital reconstruction path. It is by far not easy to design a subtracter with an accurately known transfer gain figure. In contradistinction to the digital filters, whose amplitude and frequency characteristics can be accurately preset, the characteristics of the analog filters cannot be accurately preset because these characteristics are highly dependent on the values of the integrated circuit-elements which are subject to large production spread. Therefore, in order to still further enhance the accuracy of operation, the AD converter according to the present invention may be characterized by said error signal generators comprising controlled stages for controlling the amplitude and frequency characteristics of the error signal generators and a regulator for controlling said controlled stages. Although the absolute values of the integrated circuit-elements are largely spreading and unknown, the relative spread between matched circuit-elements of the same structure in the same integrated circuit chip is much lower. This may advantageously be used in the pipeline AD converter of the present invention which may be further characterized in that the regulator comprises dummy controlled stages which are matched to the controlled stages of the error signal generators, means to control the amplitude and frequency characteristics of said dummy stages to predetermined values by control signals and means to apply these control signals to the controlled stages of the error signal generators in the cascade of AD-converter stages. A very reliable and simple regulator of this kind is characterized in that said dummy controlled stages are fed back to constitute an oscillator generating an oscillatory signal, that one control signal is derived from the amplitude of the oscillatory signal for controlling the gain of said controlled stages and that another control signal is derived from the frequency of the oscillatory signal for controlling the frequency characteristics of said controlled stages. This type of control relies upon the property that the gain of a properly oscillating circuit has exactly the value one for the oscillation signal, independent of its amplitude. The amplitude is used to generate a control signal for a variable gain stage to ensure proper oscillation. If, then, by a second control mechanism the frequency of the oscillation is set at a precisely know value, both the frequency and the gain is accurately set for one reference point in the frequency characteristic of the error generation and therewith the frequency characteristic as a whole.

BRIEF DESCRIPTION OF THE DRAWINGS

The invention will be further explained with reference to the attached figures. Herein shows.

DESCRIPTION OF THE PREFERRED EMBODIMENT

Figure 1:
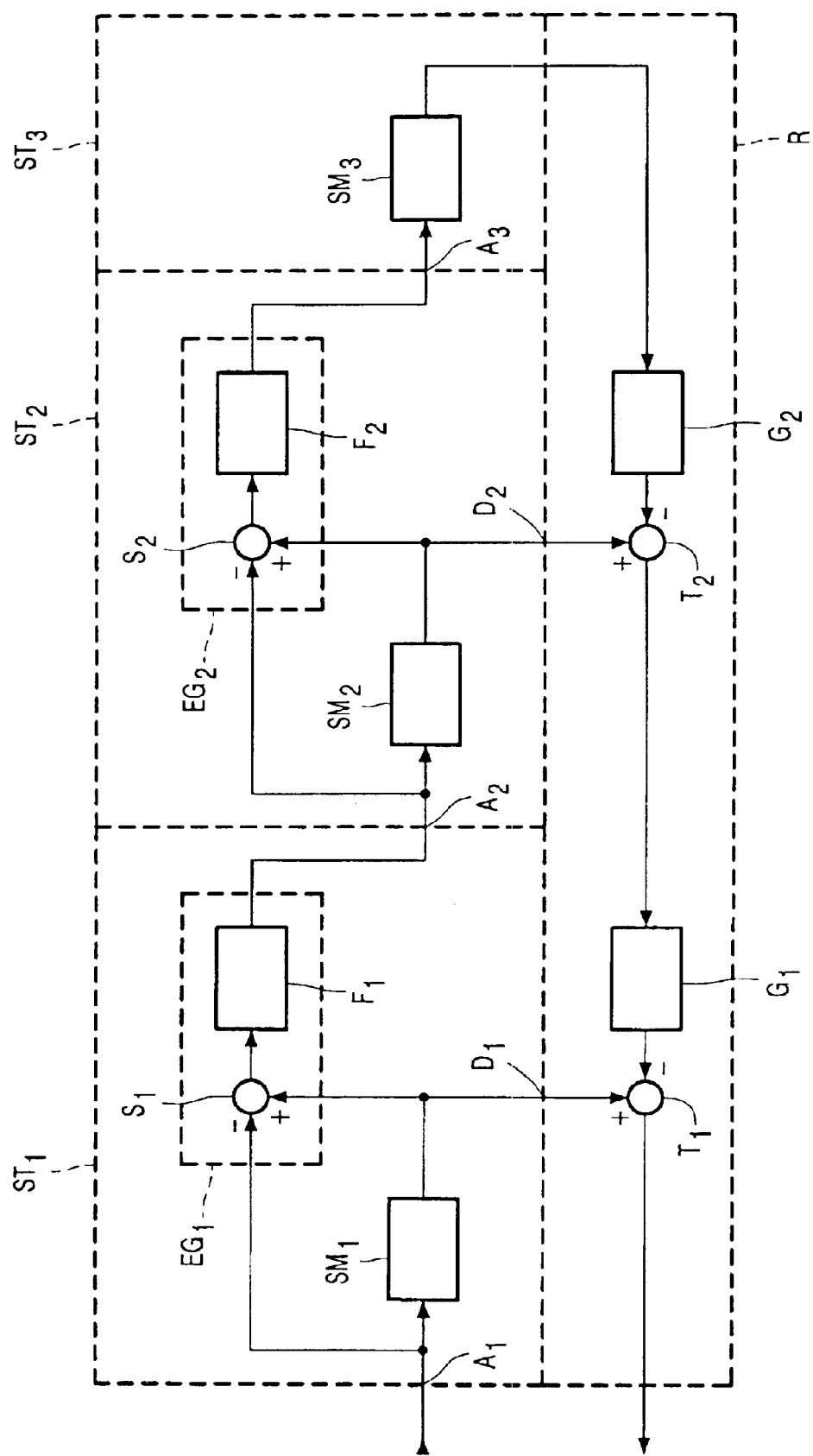
FIG. 1 a circuit diagram for explaining the principles of operation of a pipeline AD-converter, FIG. 2 a pipeline AD-converter according to the invention, FIG. 3 a more detailed diagram of one AD-converter stage of a pipeline AD-converter according to the invention, FIG. 4 a first embodiment of a regulator for use in a pipeline AD-converter according to the invention and FIG. 5 a second embodiment of a regulator for use in a pipeline AD-converter according to the invention.

The pipeline AD-converter of FIG. 1 comprises three AD-converter stages $ST_1$, $ST_2$ and $ST_3$ in cascade. In practice the cascade may comprise any number of stages larger than one. The first stage has an analog input $A_1$, a digital output $D_1$ and a synchronous ΣΔ modulator $SM_1$, whose input is coupled to the analog input $A_1$ of the stage and whose output is coupled to the digital output $D_1$ of the stage. The stage further comprises an error signal generator $EG_1$, which encompasses a subtracter $S_1$ for subtracting the analog input and the digital output of the stage, and an analog low pass filter $F_1$ for low pass filtering the result of the subtraction and for applying the so low pass filtered result to the analog input $A_2$ of the second AD-converter stage $ST_2$. The second stage $ST_2$ is identical in construction to the first stage and the elements of this second stage have the same references as the elements of stage $ST_1$, except in that the subscripts thereof have been increased by 1. The last stage $ST_3$ has a synchronous ΣΔ modulator $SM_3$, connected between the analog input $A_3$ of this stage and the digital output $D_3$. This stage has no error signal generator.

In operation a wideband error occurs in the ΣΔ modulator $SM_1$. This error, which is hereafter called the "first error", is derived in the error signal generator $EG_1$ by the subtracter $S_1$ that takes the difference between the coded digital signal at the output $D_1$ and the analog input signal at the input $A_1$. This first error signal is low pass filtered in the filter $F_1$ and coded again in the second stage $ST_2$. The result of the modulation in the second ΣΔ modulator $SM_2$ is the coded first error plus a second error that is originated in the second modulator $SM_2$. This second error is derived and filtered in the second error generator $EG_2$ and applied to the third ΣΔ modulator $SM_3$ and so on. The digital signals at the outputs $D_1$, $D_2$, $D_3$ of the stages are processed and combined in a digital reconstruction path R to derive an error reduced digital reconstruction of the original analog input signal applied to the analog input $A_1$.

If this analog input signal is denoted by S, the transfer functions of the filters $F_1$ and $F_2$ by H, and the unfiltered error signals at the outputs of subtracters $S_1$ and $S_2$ by $e_1$ and $e_2$ respectively, then the coded output signal at the output $D_1$ of the first stage is $S+e_1$, the output of the subtracter $S_1$ is $e_1$ and the output of filter $F_1$ is $e_1.H$. The coded signal at the output $D_2$ of the second stage is then $e_1.H+e_2$, the signal at the output of subtracter $S_2$ is $e_2$ and the signal at the output of the low pass filter $F_2$ is $e_2.H$. The coded signal at the output $D_3$ of the third stage is $e_2.H+e_3$, wherein $e_3$ is the error generated in the third $\Sigma\Delta$ modulator $SM_3$.

The digital reconstruction path R comprises a digital high pass filter $G_2$ that has a transfer function, which is reciprocal to the transfer function of the analog low pass filter $F_2$. The coded output signal of the third stage $ST_3$ is applied to the filter $G_2$. The output of the filter $G_2$ is subtracted from the digital output of the stage $ST_2$ in a subtracter $T_2$ and the result of this subtraction is applied to a digital high pass filter $G_1$. This filter has a transfer function which is reciprocal to that of the analog low pass filter $F_1$. The output of filter $G_1$ is subtracted from the digital output of the stage $ST_1$ in a subtracter $T_1$ and the result of this subtraction constitutes the digital output of the entire arrangement. When, as is described above, the filters $F_1$ and $F_2$ both have the transfer function H then the filters $G_1$ and $G_2$ should both have the transfer function $H^{-1}$. With the notification given above, the input signal of filter $G_2$ is $e_2.H+e_3$, the output of filter $G_2$ is $(e_2.H+e_3).H^{-1}=e_2+e_3.H^{-1}$. This is subtracted in $T_2$ from the output of the stage $ST_2$ giving: $(e_1.H+e_2)-(e_2+e_3.H^{-1})=e_1.H-e_3.H^{-1}$. This signal is high pass filtered by the filter $G_1$, giving $(e_1.H-e_3.H^{-1}).H^{-1}=e_1-e_3.H^{-2}$ at the output thereof and this high pass filtered signal is subtracted in $T_1$ from the output of stage $ST_1$ giving $(S+e_1)-(e_1-e_3.H^{-2})=S+e_3.H^{-2}$. Therefore in the output signal only the error of the last stage remains. This error is substantially smaller than the original error $e_1$ and can be made still smaller if the filters $F_1$ and $F_2$ have been given a low frequency amplification which is larger than 1. Because the filters $G_1$ and $G_2$ have transfer functions which are reciprocal to those of the filters $F_1$ and $F_2$, the filters $G_1$ and $G_2$ then have a low frequency attenuation, which makes the remaining error $e_3.H^{-2}$ even smaller. It will be apparent that the remaining error in the coded output signal will be smaller when more stages in the cascade are used.

It has to be noted, that the above given calculation only applies to the low frequency spectrum of the signals, i.e. to the spectrum occupied by the original input signal. Also the requirement of reciprocity between the analog filters $F_1$ and $F_2$ to the digital filters $G_1$ and $G_2$ applies only to this part of the spectrum.

Figure 2:
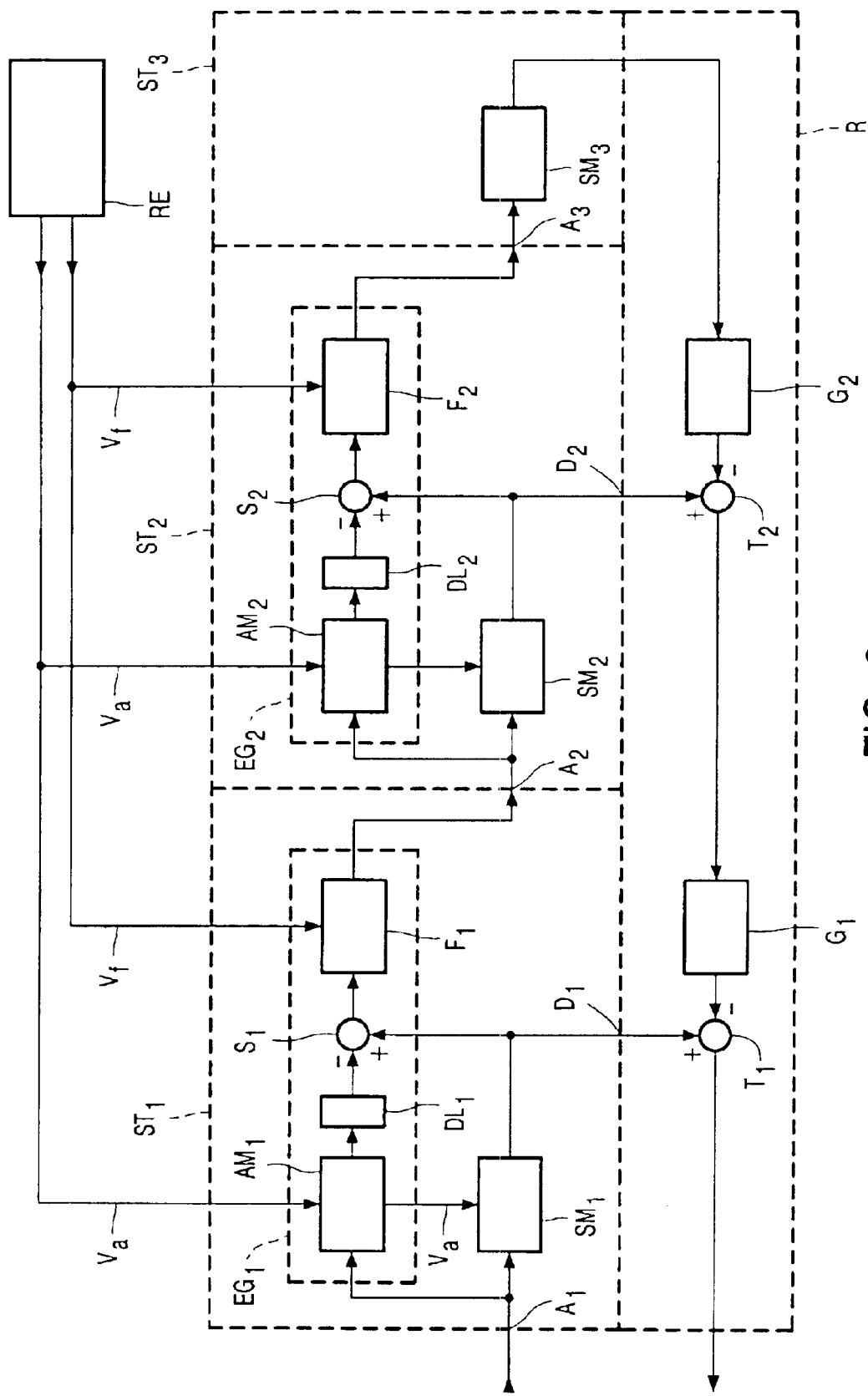

In the arrangement of FIG. 2, the elements, which have the same function as those depicted in FIG. 1 have been given the same reference numerals. In each of the error signal generators $EG_1$ and $EG_2$ of this arrangement the analog input signal is not applied directly to the subtracter $S_1$, $S_2$, but instead thereof to the input of an asynchronous $\Sigma\Delta$ modulator $AM_1$, $AM_2$, whose output is applied through a delay $DL_1$, $DL_2$ to the subtracter $S_1$, $S_2$.

Figure 3:
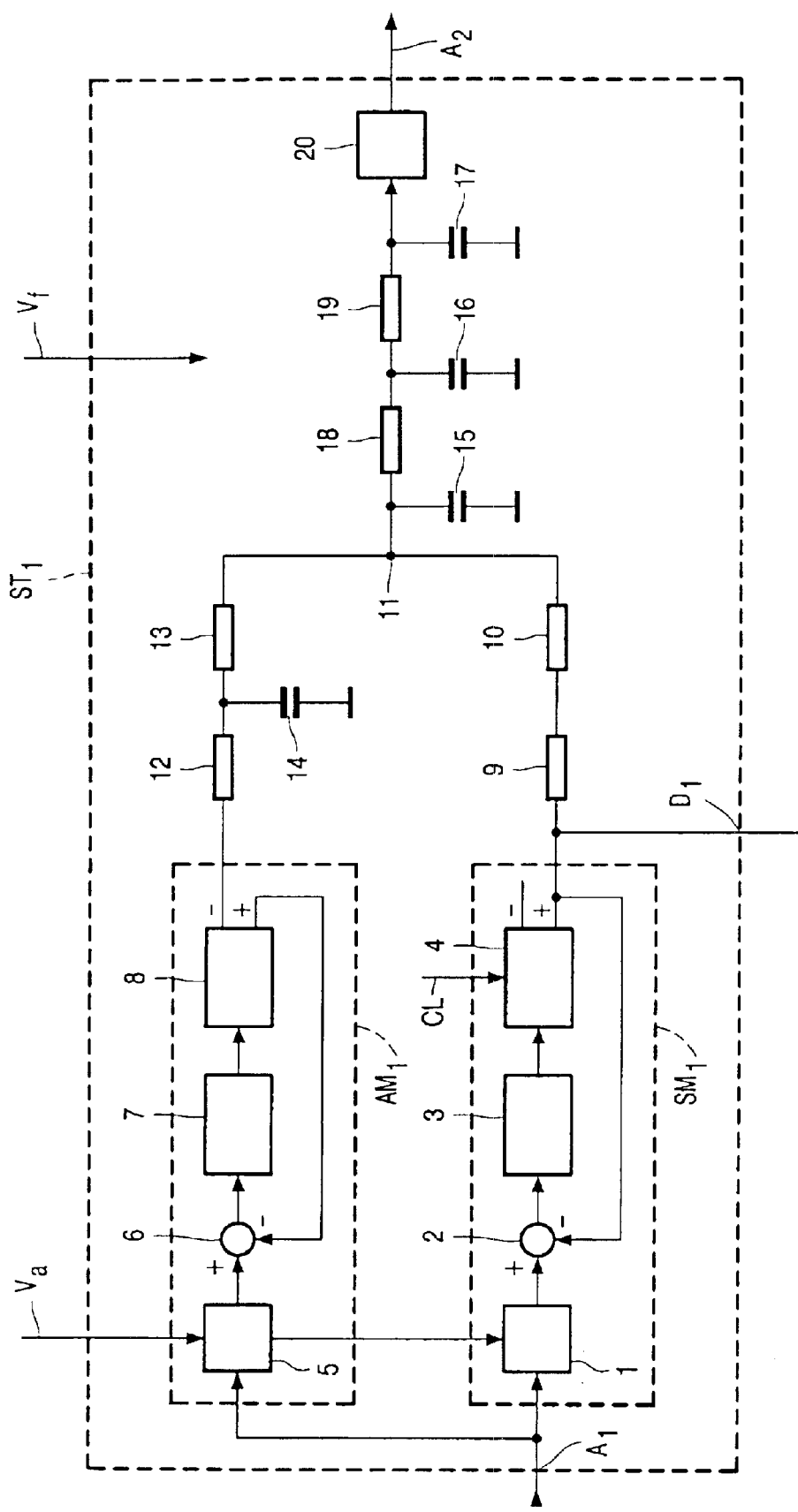

A more detailed diagram of the AD-converter stage $ST_1$ of FIG. 2 is depicted in FIG. 3. In this figure the synchronous $\Sigma\Delta$ modulator $SM_1$ comprises a transconductance amplifier 1, a subtracter 2, a lowpass filter 3 and a clock-controlled comparator 4. The positive output of the comparator is fed back to the subtracter 2 and the result of the subtraction is applied through the lowpass filter 3 to the input of the comparator 4. As is well known in the art, this arrangement generates at its digital output $D_1$ a series of equidistant, clock synchronized bits, e.g. one-bits and zero-bits or 1 bits and −1 bits, whereby the density of one-value bits is linearly proportional to the level of the analog input signal. Furthermore, the asynchronous $\Sigma\Delta$ modulator $AM_1$ comprises a transconductance amplifier 5, a subtracter 6, a low pass filter 7 and an unsynchronized comparator 8 with hysteresis. As in the synchronous $\Sigma\Delta$ modulator, also in the asynchronous $\Sigma\Delta$ modulator the positive output of the comparator is fed back to the subtracter 6 and the result of the subtraction is applied through the lowpass filter 7 to the input of the comparator 8. The asynchronous $\Sigma\Delta$ modulator generates a square wave with variable duty cycle, which duty cycle is linearly proportional to the level of the analog input signal. In both $\Sigma\Delta$ modulators the transconductance amplifier serves to convert the input signal voltage into a signal current, because it is easier to subtract currents than voltages in the subtracters 2 and 6.

The positive output of the comparator 4 is applied, through two resistances 9 and 10, to a node point 11 while the negative output of the comparator 8 is applied, through two resistances 12 and 13 to the node point 11. A small capacitance 14 connects the interconnection of the resistances 12 and 13 to ground. The node point 11 is connected, through a ladder network of three capacitances 15, 16, 17 and two resistances 18 and 19 to the input of an amplifier 20. The output of this amplifier constitutes the analog output of the modulator stage $ST_1$ that is connected to the input $A_2$ of the next stage. The network of resistances and capacitances 9 to 19 performs the functions of the delay $DL_1$, the subtracter $S_1$ and the filter $F_1$ of FIG. 2. More particularly, the subtraction of the output signals of the two $\Sigma\Delta$ modulators takes place because the positive output of comparator 4 and the negative output of comparator 8 are both connected through equal resistances 9–10 and 12–13 to the node 11, the lowpass filtering is done by the resistances 9 to 13, 18 and 19 and the capacitances 15,16 and 17 which constitute a third order transversal filter, and the delay is achieved by the relatively small capacitance 14, which gives a small delay of about one half of the sample period to the output of the asynchronous $\Sigma\Delta$ modulator. This delay is introduced because the synchronous $\Sigma\Delta$ modulator has an intrinsic mean delay of about one half the clock period.

The asynchronous $\Sigma\Delta$ modulator ensures that the output of the error signal generator substantially only represents the sampling noise generated by the synchronous $\Sigma\Delta$ modulator. Precision errors generated by the synchronous $\Sigma\Delta$ modulator, in particular the errors generated in the analog input circuit thereof, are substantially identical to the precision errors generated in the asynchronous $\Sigma\Delta$ modulator so that these errors cancel against each other when the outputs of the two modulators are subtracted. Therefore the two modulators, apart from their different comparators, are preferably matched to each other as good as practically possible.

It is preferred, and known per se in the art, that the error signal generators $EG_1$ and $EG_2$ do not only lowpass filter but also amplify the error signal. This amplification is achieved by the amplifier 20 in FIG. 3 and/or by the input circuit of the asynchronous $\Sigma\Delta$ modulator, and consequently also the input circuit of the synchronous $\Sigma\Delta$ modulator. Because the digital filters $G_1$ and $G_2$ have transfer functions that are reciprocal to those of the analog filters $F_1$ and $F_2$, this implies that the filters $G_1$ and $G_2$ will attenuate the error signals. Therefore, the error signal generated by the last modulator stage in the cascade, i.e. the error signal that is not compensated by a further stage, is attenuated by both the digital filters $G_1$ and $G_2$ and consequently added to the output of the cascade with reduced amplitude. Preferably the amplification in the filters $F_1$ and $F_2$ is made so high that nearly the full linear input range of the next $\Sigma\Delta$ modulator is used. Therefore the use of the asynchronous ΣΔ modulator in the error signal generators, which—as a consequence of increased precision—substantially minimizes the amplitude of the error signal to be handled, makes it possible to further increase the amplification of the analog filters $F_1$ and $F_2$ and the attenuation of the digital filters $G_1$ and $G_2$.

The arrangement of FIG. 2 comprises a regulator RE which delivers a control signal $V_f$ controlling the frequency characteristic of the analog filters $F_1$ and $F_2$ and a control signal $V_a$. As already noted above, this control signal $V_a$ may be applied to the filters $F_1$ and $F_2$ for controlling their amplification, however, because the synchronous and asynchronous ΣΔ modulators have substantially equal amplification characteristics, the control voltage may alternatively control the amplification of these two modulators. This is shown in FIGS. 2 and 3. The control voltage $V_a$ is applied to the two transconductance amplifiers 1 and 5 and the control voltage $V_f$ control the resistances 9–13, 18 and 19, by means of MOS-transistors whose source-drain path is included in these resistances (not shown). Instead of regulating the resistors (at least partly implemented as MOS-transistors), also the capacitors can be regulated (which then at least partly should be implemented as MOS-transistors as well).

Figure 4:
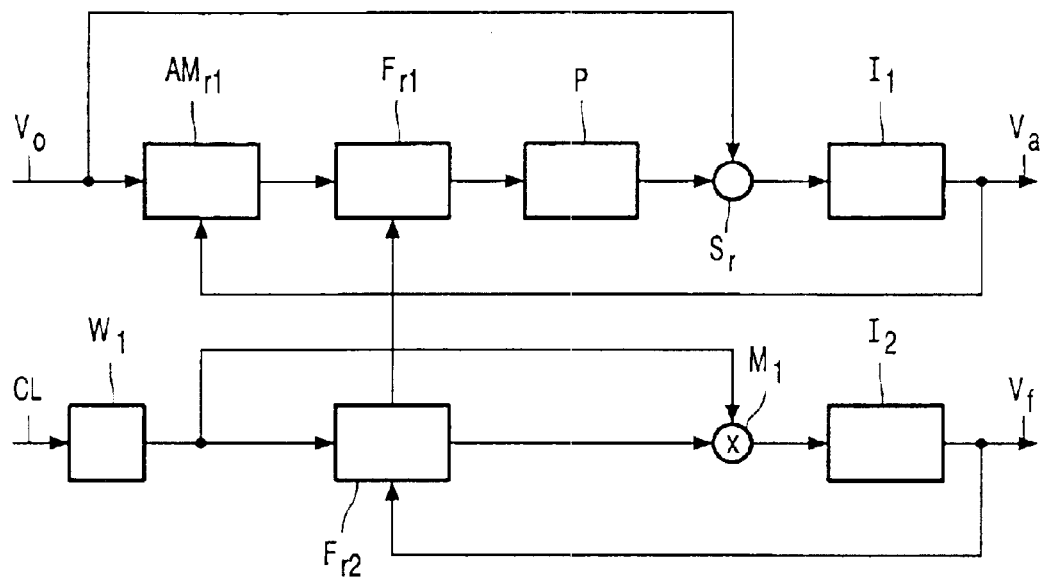

The regulator of FIG. 4 comprises a DC-path for generating the control voltage $V_a$ and an AC-path for generating the control voltage $V_f$. The DC-path contains a dummy asynchronous ΣΔ modulator $AM_{r1}$ that is matched to the asynchronous ΣΔ modulator of the cascade, a dummy low pass filter $F_{r1}$ that is matched to the filters $F_1$, $F_2$ of the cascade, a voltage or current divider P, a subtracter $S_r$ and an integrator $I_1$. A DC-voltage $V_0$ is fed to the analog input of the dummy ΣΔ modulator $AM_{r1}$ and the coded output thereof is filtered in low pass filter $F_{r1}$ to generate an amplified DC-voltage. The divider P takes an accurate fraction of this amplified DC-voltage and this fraction is in the subtracter $S_r$ compared with the original DC-voltage $V_0$ The result of this comparison is integrated in the integrator $I_1$ to get the control voltage $V_a$ and this control voltage is fed back to control the amplification of the dummy ΣΔ modulator $AM_{r1}$. When the loop gain is sufficiently high the feedback causes the said accurate fraction from the divider P to be equal to the input voltage $V_0$ so that the DC-amplification of the dummy ΣΔ modulator $AM_{r1}$ plus the dummy filter $F_{r1}$ is practically equal to the reverse of said accurate fraction. Because the same control voltage $V_a$ is applied to the ΣΔ modulator of the cascade and because the ΣΔ modulator $AM_{r1}$ is matched to these ΣΔ modulators of the cascade it is assured that the DC-amplification of the error generators of the cascade is substantially equal to the reverse of said fraction. Consequently, this amplification can be matched to the attenuation of the digital filters $G_1$ and $G_2$ by properly choosing the division ratio of the divider P. In practice the divider P may be realized with matched current sources.

The AC-path of the regulator of FIG. 4 comprises a dummy low pass filter $F_{r2}$ which is matched to the low pass filters $F_1$ and $F_2$ of the cascade and to the dummy low pass filter $F_{r1}$ of the DC-path. A frequency divider $W_1$ generates an AC-signal that is a sub multiple of the clock frequency CL and applies this AC-signal to the input of the dummy low pass filter $F_{r2}$. A frequency multiplier $M_f$ multiplies the output and input signals of this low pass filter with each other and the DC-component resulting there from after integration in an integrator $I_2$ constitutes the control voltage $V_f$ which is used to control the frequency characteristic of the dummy filter $F_{r2}$ and of the other matched low pass filters. When the loop gain of this control circuit is sufficiently high the control voltage $V_f$ controls the frequency characteristics of these filters so that they have a phase shift of 90° at the frequency determined by the frequency divider $W_1$.

The DC-path of the regulator of FIG. 4 has some sensitivity for DC-offset voltages, which is detrimental for the accuracy of the gain control of the error signal generators in the cascade. Therefore, in the alternative regulator shown in FIG. 5, such DC-path is avoided. As in the arrangement of FIG. 4 the arrangement of FIG. 5 contains a dummy asynchronous ΣΔ modulator $AM_{r2}$ which is matched to the ΣΔ modulators of the cascade and a dummy low pass filter $F_{r3}$ which is matched to the filters $F_1$, $F_2$ of the cascade. The negative output of the asynchronous ΣΔ modulator $AM_{r2}$ is fed to the low pass filter $F_{r3}$ and the output of this filter is fed back to the input of the asynchronous ΣΔ modulator $AM_{r2}$. When the low pass filter is a third order filter, an oscillating circuit is constituted which oscillates at a frequency at which the low pass filter exhibits a phase shift of 180°. An automatic gain control circuit comprising an amplitude detector Q and an integrator $I_3$ detects the output level of this oscillator and delivers the control signal $V_a$. This signal controls the gain of the dummy asynchronous ΣΔ modulator $AM_{r2}$ so that the modulator remains in its linear range. When the modulator operates in its linear range the gain of dummy modulator plus dummy filter is exactly equal to 1 at the frequency of oscillation. This implies that for DC and low frequencies the gain of modulator plus filter is fixed and exactly known. E.g. when the low pass filter is a third order ladder of three equal resistances R and three equal capacitances C, then the system oscillates at a frequency which is equal to $\sqrt{\Box 6}/2\pi RC$ and the DC-gain is fixed at 29.

Figure 5:
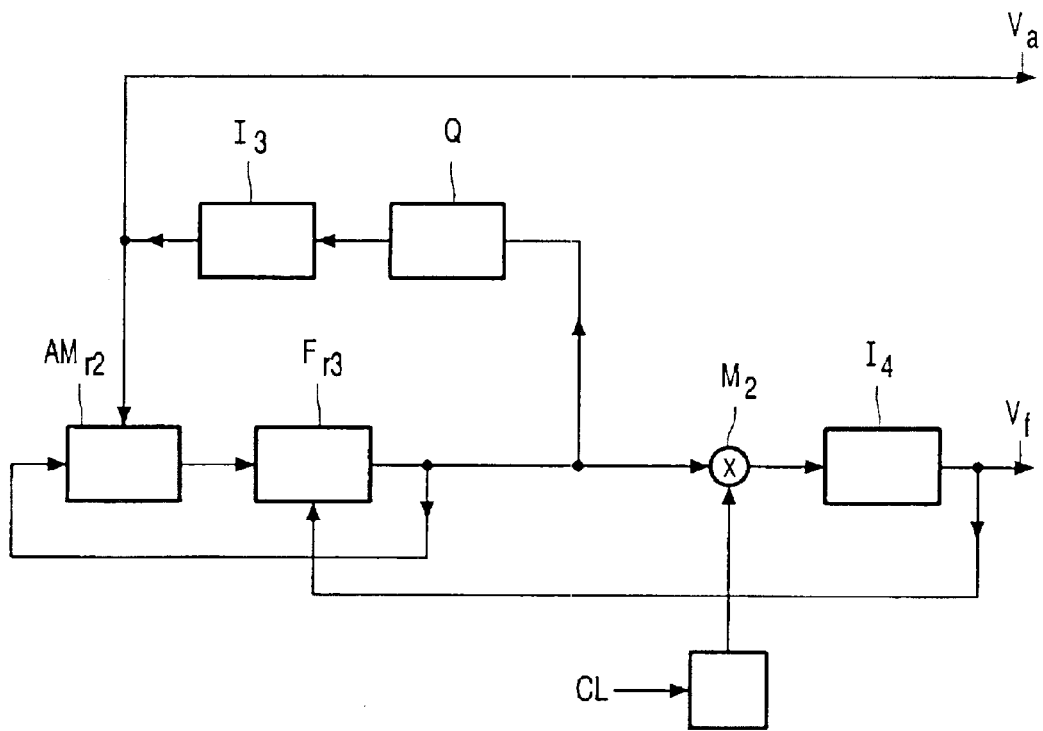

The regulator of FIG. 5 further comprises a frequency mixer $M_2$ which mixes the oscillation from the oscillator $AM_{r2}$, $F_{r3}$ with a sub multiple of the clock frequency which is derived by a frequency divider $W_2$. The output signal of the mixer $M_2$ is smoothed in an integrator $I_4$ to create the control voltage $V_f$. This control voltage is used to control the frequency characteristic of the dummy filter $F_{r3}$ of the regulator and of the low pass filters $F_1$ and $F_2$ of the cascade. The mixer $M_2$, the integrator $I_4$ and the filter $F_{r3}$ together form a phase locked loop which forces the oscillator $AM_{r2}$, $F_{r3}$ to oscillate at the exactly known sub multiple of the clock.

What is claimed is:

1. A pipeline AD-converter comprising a cascade of AD-converter stages (ST), each having an analog input (A), a digital output (D) and a synchronous ΣΔ modulator (SM) with an input coupled to said analog input and an output coupled to said digital output of the stage, each AD-converter stage of the cascade, except the last one, further comprising an error signal generator (EG) for generating a baseband error signal from the signal applied to said analog input and the signal derived from said digital output and for applying the baseband error signal to the analog input of the next AD-converter stage in the cascade, the pipeline AD-converter further comprising a digital signal reconstruction path (R) receiving the digital outputs of the AD-converter stages (ST) and generating there from an error-reduced digital representation of the analog signal applied to the analog input ($A_1$) of the first stage in the cascade, characterized in that said error signal generator (EG) comprises an asynchronous ΣΔ modulator (AM) having an input connected to the analog input (A) of the AD-converter stage, means (S) for subtracting the signals from the outputs of the synchronous and the asynchronous ΣΔ modulators and means (F) for low pass filtering the result of the subtraction and for applying the filtered signal as error signal to the analog input of the next AD-converter stage in the cascade.

2. A pipeline AD-converter as claimed in claim 1, characterized by delay means (DL) in the output of the asynchronous ΣΔ modulator (AM) for compensating the delay of the synchronous ΣΔ modulator (SM).

3. A pipeline AD-converter as claimed in claim 1, characterized by said error signal generators (EG) comprising controlled stages (AM, F) for controlling the amplitude and frequency characteristics of the error signal generators and a regulator (RE) for controlling said controlled stages.

4. A pipeline AD-converter as claimed in claim 3 characterized in that the regulator (RE) comprises dummy controlled stages (AMr, Fr) which are matched to the controlled stages (AM, F) of the error signal generators, means to control the amplitude and frequency characteristics of said dummy stages to predetermined values by control signals ($V_a$, $V_f$) and means to apply these control signals to the controlled stages (AM, F) of the error signal generators in the cascade of AD-converter stages.

5. A pipeline AD-converter as claimed in claim 4 characterized in that said dummy controlled stages ($AM_{r2}$, $F_{r3}$) are fed back to constitute an oscillator generating an oscillatory signal, that one control signal ($V_a$) is derived from the amplitude of the oscillatory signal for controlling the gain of said controlled stages and that another control signal ($V_f$) is derived from the frequency of the oscillatory signal for controlling the frequency characteristics of said controlled stages.

* * * * *